(12) United States Patent
Roan et al.

(10) Patent No.: US 10,483,028 B2
(45) Date of Patent: Nov. 19, 2019

(54) ELECTRICAL ASSEMBLY HAVING CAVITIES FOR COOLANT

(71) Applicant: Deere & Company, Moline, IL (US)

(72) Inventors: Thomas J. Roan, Fargo, ND (US); Erich J. Drees, Dilworth, MN (US); David M. Loken, West Fargo, ND (US); Christopher J. Schmit, Fargo, ND (US)

(73) Assignee: DEERE & COMPANY, Moline, IL (US)

( * ) Notice: Subject to any disclaimer, the term of this patent is extended or adjusted under 35 U.S.C. 154(b) by 124 days.

(21) Appl. No.: 15/845,547

(22) Filed: Dec. 18, 2017

(65) Prior Publication Data

US 2019/0189329 A1    Jun. 20, 2019

(51) Int. Cl.
| | |
|---|---|
| *H01F 27/10* | (2006.01) |
| *H01F 27/02* | (2006.01) |
| *H01F 27/08* | (2006.01) |
| *H01F 37/00* | (2006.01) |
| *H05K 7/20* | (2006.01) |

(52) U.S. Cl.
CPC ......... *H01F 27/025* (2013.01); *H01F 27/085* (2013.01); *H01F 27/10* (2013.01); *H01F 37/00* (2013.01); *H05K 7/20927* (2013.01)

(58) Field of Classification Search
CPC ................................................ H01F 27/00–36
USPC ..................................................... 336/55–62
See application file for complete search history.

(56) References Cited

U.S. PATENT DOCUMENTS

| | | | |
|---|---|---|---|
| 8,274,351 B2* | 9/2012 | Kiuchi | H01F 27/2876 336/57 |
| 2010/0156583 A1* | 6/2010 | Solar | H01F 27/306 336/62 |
| 2010/0326750 A1 | 12/2010 | Murakami | |
| 2013/0223011 A1 | 8/2013 | You et al. | |
| 2014/0096938 A1 | 4/2014 | Kojima et al. | |
| 2014/0118932 A1 | 5/2014 | Harmelink et al. | |
| 2014/0284028 A1 | 9/2014 | Yoshida | |
| 2017/0181333 A1 | 6/2017 | Kosaka | |

OTHER PUBLICATIONS

Search Report issued in counterpart application No. EP18205991.5, dated Jun. 21, 2019 (8 pages).

* cited by examiner

*Primary Examiner* — Tuyen T Nguyen (57) ABSTRACT

The first wall has a first inbound cavity for receiving a coolant from an inlet port. The first wall has a first outbound cavity for directing the coolant from the inbound cavity to the input of the transition passage. The second wall has a second inbound cavity for receiving a coolant from the output of the transition passage. The second wall has a second outbound cavity for directing the coolant from the inbound cavity to the outlet port. The transition passage comprises a transverse hollow volume for interconnecting the first outbound cavity of the first wall to the second inbound cavity of a second wall. At least one heat-generating component (e.g., inductor) in the interior of the housing generates heat that is dissipated.

13 Claims, 7 Drawing Sheets

ELECTRICAL ASSEMBLY HAVING CAVITIES FOR COOLANT

FIELD

This disclosure relates to an electrical assembly having cavities for coolant.

BACKGROUND

Inductors may carry electrical current or power of such a magnitude as to generate considerable heat. In certain prior art, the inductors are air-cooled by ambient air contacting or circulating around the windings or conductors of the inductors. In some other prior art, the inductors are cooled by liquid coolant via a heat sink that provides only limited heat dissipation. Thus, there is need for an electrical assembly having cavities for coolant, where the electrical assembly has improved heat dissipation with respect to the aforementioned air-cooled configuration and liquid-cooled configuration.

SUMMARY

In one embodiment, an electrical assembly comprises a housing with a first wall and second wall that are interconnected by a transition passage. The first wall has a first inbound cavity for receiving a coolant from an inlet port. The first wall has a first outbound cavity for directing the coolant from the inbound cavity to an input of the transition passage. The second wall has a second inbound cavity for receiving a coolant from the output of the transition passage. The second wall has a second outbound cavity for directing the coolant from the inbound cavity to the outlet port. The transition passage comprises a transverse hollow volume for interconnecting the first outbound cavity of the first wall to the second inbound cavity of a second wall. At least one heat-generating component (e.g., inductor) in the interior of the housing is associated with a gap between the at least one heat-generating component (e.g., inductor) and the first wall or the second wall, where the heat-generating component (e.g., inductor) is covered by a thermal interface material to fill the gap.

BRIEF DESCRIPTION OF THE DRAWINGS

Like reference numbers in any group of drawings indicates like elements in the group of drawings.

DETAILED DESCRIPTION

Figure 1:
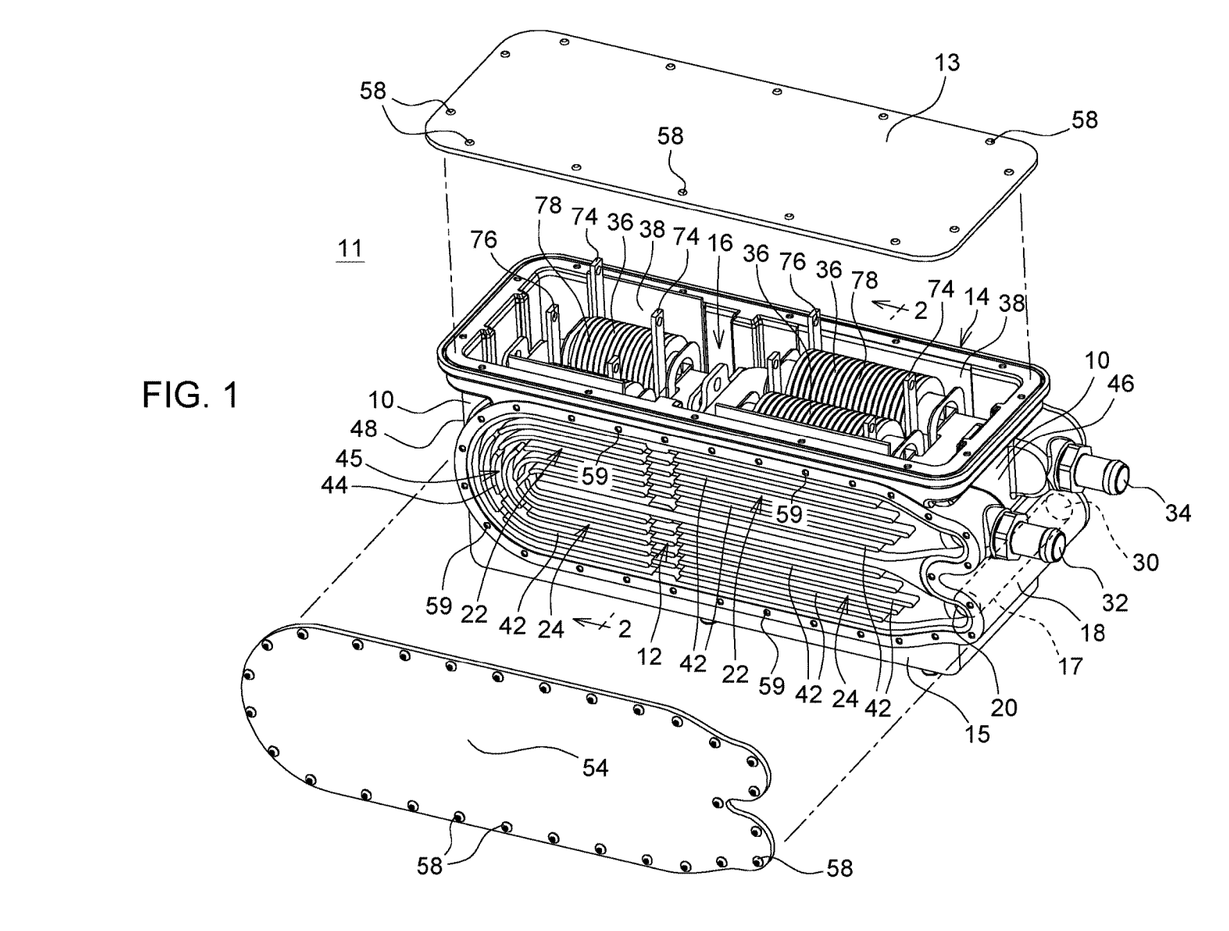
FIG. 1 is perspective view of one embodiment of an electrical assembly, where the electrical assembly is illustrated as partially exploded.

In one embodiment as illustrated in FIG. 1, an electrical assembly 11 comprises a housing 10. In one configuration, the housing 10 comprises a first wall 12 and a second wall 14 spaced apart from the first wall 12, a base 15 or floor and a cover 13. An interior 16 is defined between the first wall 12, the second wall 14, the base 15 and cover. The housing 10 may further feature a transition passage 18 on a front side 46 or rear side 48. As illustrated, the front side 46 has an inlet port 32 for inputting coolant and an output 30 port for outputting coolant, where the inputted coolant is typically lower in temperature than the outputted coolant.

Figure 2:
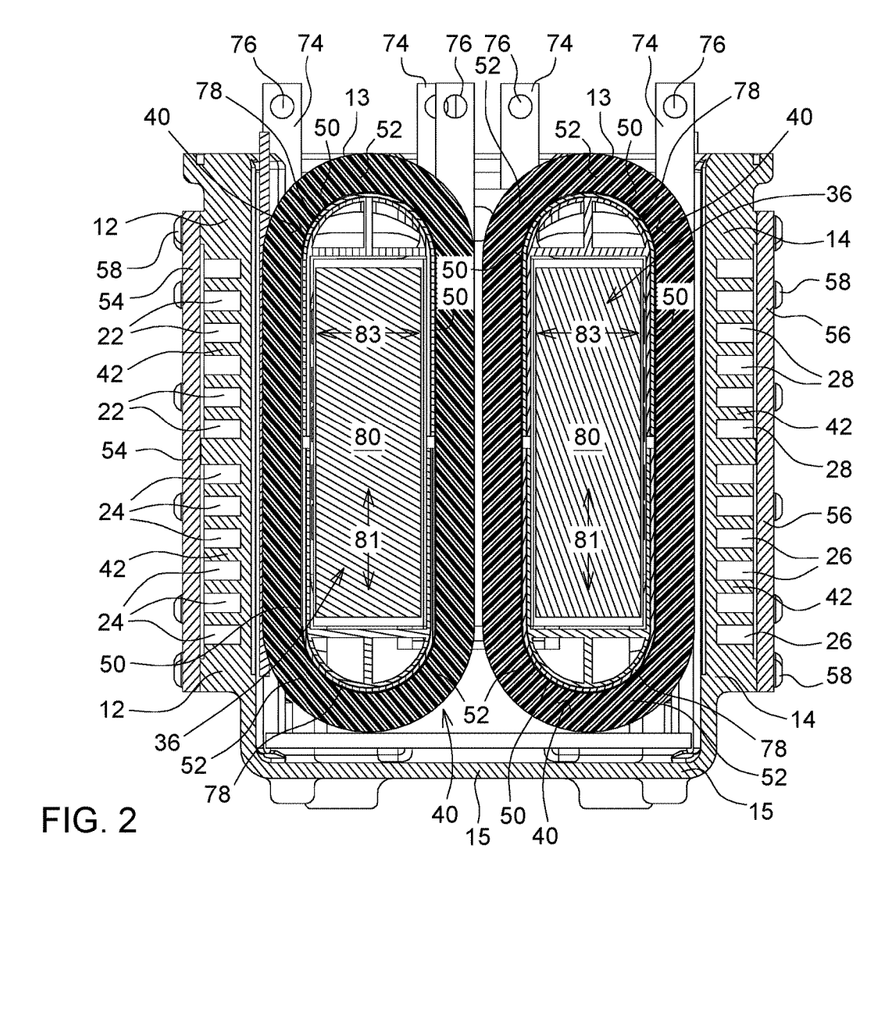
FIG. 2 is a cross-sectional view of the electrical assembly of FIG. 1 as viewed along reference line 2-2 of FIG. 1.

Although the outer surfaces of the housing 10 are generally planar as illustrated in FIG. 1 and FIG. 2, in alternate embodiments, the outer surfaces of the housing 10, the cover 13, the first cover plate 54, and the second cover plate 56 may have fins or protrusions for enhanced cooling to the ambient air or environment.

In one embodiment, the first wall 12 has a first inbound cavity 22 for receiving a coolant from an inlet port 32. The first wall 12 has a first outbound cavity 24 for directing the coolant from the inbound cavity 22 to the input 20 of the transition passage 18. A first interface cavity region 45 in the first wall 12 supports hydraulic or fluidic communication between the first inbound cavity 22 and the first outbound cavity 24. In one configuration, the combination of the first wall 12 and the first cover plate 54 comprises a first heat exchanger. Further, in one configuration, the first inbound cavity 22 and the first outbound cavity 24 are defined by a set of parallel channels.

The second wall 14 has a second inbound cavity 26 for receiving a coolant from the output 30 of the transition passage 18. The second wall 14 has a second outbound cavity 28 for directing the coolant from the inbound cavity to the outlet port 34. A second interface cavity region in the first wall 12 supports hydraulic or fluidic communication between the second inbound cavity 26 and the second outbound cavity 28. In one configuration, the combination of the second wall 14 the second cover plate 56 comprises a second heat exchanger. Further, in one configuration, the second inbound cavity 26 and the second outbound cavity 28 are defined by a set of parallel channels.

In one embodiment, a first cover plate 54 is associated with the first wall 12 and a second cover plate 56 is associated with the second wall 14. The first cover plate 54 covers the first inbound cavity 22, the second outbound cavity 28, and the first interface region 45. A second cover plate 56 covers the second inbound cavity 26, the second outbound cavity 28, and the second interface region, which is similar to the first interface region 45. As illustrated, the first cover plate 54 and the second cover plate 56 each have a series of openings 57 around their respective perimeters. The openings 57 align with corresponding threaded bores 59 in the first wall 12 and the second wall 14, where the openings 57 and threaded bores 59 are aligned to receive respective fasteners 58. Fasteners 58 secure or attach the first cover plate 54 and the second cover plate 56 to opposite sides (e.g., side portions or walls 12, 14) of the electrical assembly 11. Similarly, fasteners 58 secure of attach the cover 13 to an upper portion of the electrical assembly 11.

In an alternate embodiment, the first cover plate 54 forms a hermetic seal against the first wall 12 or a recess (e.g., step or groove) in the first wall 12 to contain the coolant within the first inbound cavity 22, the first outbound cavity 24 and first interface region 45. Similarly, the second cover plate 56 forms a hermetic seal against the second wall 14 or a recess (e.g., step or groove) in the second wall 14 to contain the coolant to form the hermetic seal that prevents the egress of coolant from the second inbound cavity 26, second outbound cavity 28, and the second interface region. The first cover plate 54 and the first wall 12 may be associated with a seal, a sealant or a gasket to form the hermetic seal that prevents the egress of coolant from the cavities within the first wall 14 or first heat exchanger. Similarly, the second cover plate 56 and second wall 14 may be associated with a seal, a sealant or a gasket to form the hermetic seal that prevents the egress of coolant from the cavities within the second wall 14 or second heat exchanger.

In one embodiment, referring to FIGS. 1 and 2, a transition passage 18 has an input 20 and an output 30 (indicated by dashed lines) to support communication, circulation or transfer of coolant between the hollow first wall 12 the hollow second wall 14, or between the first heat exchanger and the second heat exchanger. The transition passage 18 comprises a transverse hollow volume 17 (indicated in phantom by dashed lines) or chamber (e.g., generally tubular or cylindrical volume) for interconnecting the first outbound cavity 24 (e.g., lower cavity) of the first wall 12 to the second inbound cavity 26 (e.g., lower cavity) of a second wall 14. In other words, the transition passage 18 connects the first heat exchanger to the second heat exchanger to support dual-sided cooling of one or more inductors 36 in the housing 10.

In FIG. 1, the first inbound cavity 22 comprises inbound axial ridges 42 or longitudinal ridges to direct a flow of the coolant between a front side 46 and a rear side 48 of the housing 10. Similarly, the first outbound cavity 24 comprises outbound axial ridges 42 or longitudinal ridges to direct a flow of coolant between the front side 46 and rear side 48. In one embodiment, in a first interface region 45, one or more curved ridges 44 or arced ridges connects or falls between the inbound axial ridges 42 and the outbound axial ridges 42 to direct coolant from an inbound flow path to an outbound flow path. For example, a set of curved ridges 44 provide an interface between the first inbound cavity 22 and the first outbound cavity 24.

In FIG. 2, the second inbound cavity 26 comprises inbound axial ridges 42 or longitudinal ridges to direct a flow of the coolant between a front side 46 and a rear side 48 of the housing 10. Similarly, the second outbound cavity 28 comprises outbound axial ridges 42 to direct a flow of coolant between the front side 46 and rear side 48. In one embodiment, in a second interface region, one or more curved ridges 44 or arced ridges connects or falls between the inbound axial ridges 42 and the outbound axial ridges 42 to direct coolant from an inbound flow path to an outbound flow path. For example, a set of curved ridges provide an interface between the second inbound cavity 26 and the second outbound cavity 28.

In one embodiment, the housing 10 provides an enclosure or mounting structure with integral cooling or heat dissipation for one or more inductors 36. At least one inductor 36 in the interior 16 of the housing 10 is associated with a gap 38 between the at least one conductor and the first wall 12 or the second wall 14, where the inductor 36 is covered by a thermal interface material 40 to fill the gap 38.

In one embodiment, each inductor 36 has a core 80, such as laminated steel plates, a ferric core, an iron core, or a ferrite core. The core 80 may enhance or increase the inductance over a similar air-wound coil of substantially equivalent size or dimensions, for instance. The inductor 36 comprises wire or conductors that are wound around the core 80 and that terminate in two terminals 74. As illustrated in FIG. 1, the terminals 74 are generally oriented vertically and appear as metal bars or electrically conductive busses. Further, the terminals 74 have optional bores 76 for connecting cables, wires or connectors.

In one embodiment, the core 80 has mounting feet for secure or rigid mounting to the bottom of the housing 10, for example.

In an alternate embodiment, a tube, a serpentine tube, a circuitous tube, or a set of tubes could be routed through or around each core 80 for additional flow of coolant through the core 80, where the ends of each tube are connected to the ports in the wall, for instance.

In one embodiment, the core 80 may be substantially rectangular, oblong, oval, toroidal, donut shaped or cylindrical. Similarly, the wires, conductors or windings 78 have an exterior surface that may be substantially rectangular, oblong, oval, toroidal, donut shaped, or cylindrical. In one embodiment, a thermal interface material 40 may overlie the exterior surface of the wires, conductors or windings 78. For example, the thermal interface material 40 may be bonded to the exterior surface by an adhesive or a thermal interface layer.

The thermal interface material 40 may be formed or defined in different configurations in various examples, which may apply separately or cumulatively. In a first example, the thermal interface material 40 comprises a flexible thermally conductive pad of shape, size and dimensions to fill a gap 38 or air gap 38 (FIG. 1) between each inductor 36 or set of inductors 36 and the interior 16 (e.g., interior surface or inner vertical wall) of the housing 10.

In a second example, the interface material comprises an inner thermal interface layer 50 that contacts the at least one inductor 36 and an outer thermal interface layer 52 contacting an interior 16 surface of the first wall 12 or the second wall 14.

In a third example, the thermal interface material 40 has a generally oval or oblong shape that conforms to the outer surface of the at least one inductor 36. In a fourth example, the inner thermal interface layer 50 comprises a polyimide film or a polyethylene terephthalate film.

In a fifth example, the thermal interface material 40 comprises a thermally conductive potting material or filler, such as potting around the outside of the windings 78 of each inductor 36. For example, the potting could be added to the inductors 36 if electrical noise or higher core 80 losses were encountered. Further, the potting could be added to reduce, dampen or eliminate vibration in the windings 78, particularly for on-road or off-road vehicle applications.

In a sixth example, the thermal interface material 40 comprises a thermally conductive potting material or filler, such as potting around or adjoining an inner side or central side of the windings 78 of each inductor 36. For example, the potting or could be added to the inductors 36 if electrical noise or higher core 80 losses were encountered. Further, the potting could be added to reduce, dampen or eliminate vibration in the windings 78, particularly for on-road or off-road vehicle applications.

In one embodiment, the potting can provide positive heat transfer path: (1) from the windings 78 to the core 80 of the same inductor 36 or an adjacent inductor 36, and/or (2) from the windings 78 to the first heat exchanger via the first wall 12, the second heat exchanger via the second wall 14, or both.

In an alternate embodiment, the thermal interface materials (40) may comprise paste, tape, or metallic compounds, for example.

In another alternate embodiment, the thermal interface layer can be eliminated if the manufacturing tolerances between the inductors 36 and the interior 16 of the housing 10 can be controlled to maintain a clearance air gap 38 or a press-fit (e.g., without any air gap 38) between the interior 16 of the housing 10 and the inductor 36, such that there is contact between the exterior surface of the inductor 36 (e.g., along its vertical axis) and the housing 10 (e.g., vertical interior 16 of the first wall 12, the second wall 14 or both).

Here, each inductor 36 can be arranged within the interior 16 of the assembly to be cooled by the coolant that circulates in the cavities in the first wall 12, the second wall 14, or both. The inductors 36 may be used in power electronics configuration, such as in conjunction with an inverter, converter, motor, generator, or other electric machine. One or more inductors 36 are used for filtering, matching impedance of loads, or storing electrical energy, for example.

Each inductor 36 generates heat that can limit or degrade performance materially if the heat exceeds a certain threshold level. If sufficient heat is dissipated or removed from each inductor 36, the heat will not exceed the threshold level and the performance of the inductor 36 will be sufficient or adequate for the demands of the electrical or electronic assembly. Further, if each inductor 36 can perform in accordance with its thermal specifications on a consistent basis, over-sized, heavier or additional inductors 36, which would otherwise be required to compensate for heat degradation, are not necessary. Each inductor 36 generates heat or thermal energy that flows outward, via the thermal interface, and is conducted toward the first wall 12, the second wall 14, or both, to dissipate the heat, thereby cooling each inductor 36. The heat is removed via the coolant that is circulated in the first wall 12, the second wall 14, or both, and/or via the coolant contacting a first cover plate 54 or a second cover plate 56. In certain embodiments, the first cover plate 54 and the second cover plate 56 may have radiating fins or protrusions to improve heat dissipation to the ambient air.

If the inductor 36 has a single winding or multiple windings 78, a separate first thermal path can be provided from a first winding of the inductor 36 outward toward the first wall 12 and a separate second thermal path can be provided from a second winding of the inductor 36 outward toward the second wall 14, where both the first wall 12 and the second wall 14 can house or circulate coolant for heat dissipation. Accordingly, the first wall 12 and the second wall 14 provide efficient dual-sided cooling for one or more inductors 36.

Figure 5:
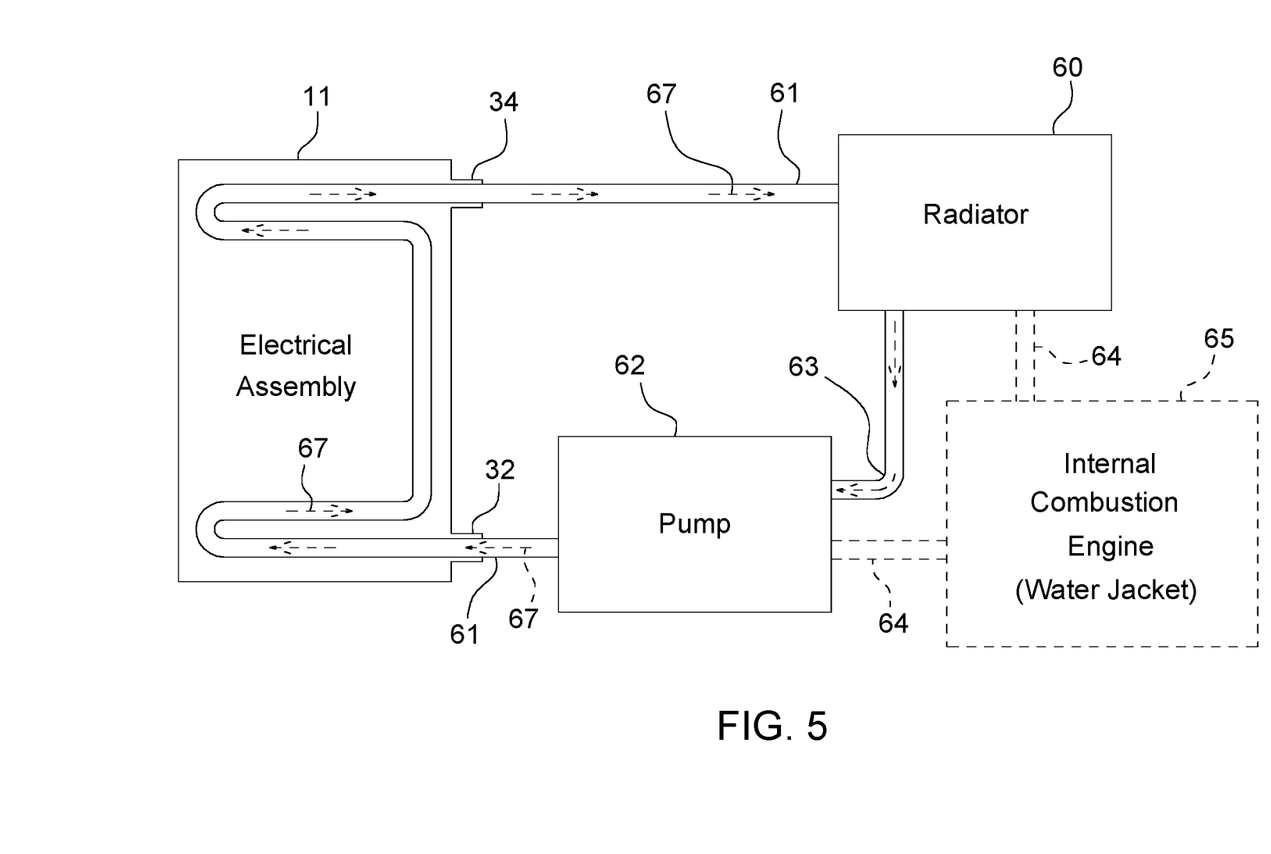
FIG. 5 is a perspective view of an electrical assembly that is associated with a pump and a radiator for circulating coolant.

FIG. 5 is a perspective view of an electrical assembly 11 that is associated with a pump 62 and a radiator 60 for circulating coolant. In one embodiment, a radiator 60 is adapted for receiving coolant (e.g., heated coolant at a greater temperature than coolant at the inlet port 32) from the outlet port 34 via tubing 61. In one configuration, the pump 62 is connected in series with the radiator 60 via tubing 63 (e.g., via an engine bypass path) to circulate coolant (e.g., cooled coolant at a lesser temperature than coolant at the output port 34) from the radiator 60 into an inlet port 32 of the electrical assembly 32.

Within the electrical assembly 11, the fluid is circulated within the cavities (22, 24, 26, 28), the transition passage 18. In one embodiment, the hollow first wall 12 and the first respective cover plate 54 form a first heat exchanger, the hollow second wall 14 and the second respective cover plate 56 form a second heat exchanger, and the transition passage communicates coolant between the first heat exchanger and the second heat exchanger. Arrows in FIG. 5 indicate an illustrative path of the coolant flow.

FIG. 5 illustrates an optional internal combustion engine 65 with a jacket or coolant passages for routing coolant through the internal combustion engine 65. The internal combustion engine 65 is illustrated in dashed lines to show that it is optional. Similarly, the tubing 64 that connects the optional internal combustion engine 65 between the radiator 60 and the pump 62 is also shown an optional by the dashed lines.

FIG. 2 is a cross-sectional view of the electrical assembly of FIG. 1 as viewed along reference line 2-2 of FIG. 1. As illustrated in FIG. 2, the cross section of the housing 10 comprises two oblong or U-shaped inductors 36 disposed laterally or side by side with respect to each other. A core 80 of the inductor 36 is located at the center or central portion of the inductor 36. One or more windings 78 are wound around the core 80 (e.g., iron core 80), where the metallic or ferrite core 80 can enhance or increase the inductance of the inductor 36 in comparison to an air core. In practice, each winding comprises insulated wire or a conductor (e.g., copper) coated with dielectric material that is wound around the core 80.

In one embodiment, as best illustrated in FIG. 2, each inductor 36 is wrapped or surrounded by a thermal interface material 40, where the thermal interface material 40 contacts the winding for heat conduction outward from the core 80. The thermal interface material 40 provide a thermal conductive path outward from each inductor 36, where the thermal interface material 40 facing the first wall 12, the second wall 14 or both provides the lowest thermal resistance and optimal cooling via the first heat exchanger and the second heat exchanger. Although other configurations are possible, the thermal interface material comprises an inner thermal interface material 50 engaging, contacting or bonded to the dielectric layer of the windings 78 and an outer thermal layer 52 overlying the inner thermal interface material.

As illustrated, the thermal interface material 40 fills an air gap 38 between each inductor 36 an inner surface of the first wall 12 and the second wall 14, or an inner vertical surface of an interior 16 of the housing 10. In one embodiment, the thermal interface material 40 is compressible to fill the air gap 38 between the each inductor 36 and the interior 16 of the housing 10 to form a positive thermal interface between the inductor 36 windings 78 and the heat-sinking first wall 12 and the heat-sinking second wall 14.

As illustrated in FIG. 2, the longer axis 81 (e.g., vertical axis) or longer side of the inductor 36 faces, or is generally parallel to, the first wall 12, the second wall 14 or both to provide heat transfer to the walls (12, 14) or heat exchangers through a greater surface area than would be possible through the shorter axis 83 or shorter side of the inductor 36. Owing to the longer axis 81 facing the hollow walls (12, 14) with circulated coolant inside, the greater surface area of the cooling provides efficient cooling of most or all of the segments of the winding 78. Even those portions of the windings 78 that do not directly contact the thermal pad 40 (e.g., inner thermal interface layer 50) are cooled efficiently. For example, for each inductor 36 the horizontal winding portions of the shorter axis 83 are cooled via a low thermal resistance path provided by the longer axis 81 of the vertical winding portions (of the winding 78) that contacts the thermal interface material 40; hence, dissipates heat via the first wall 12 and the second wall 14.

Figure 3:
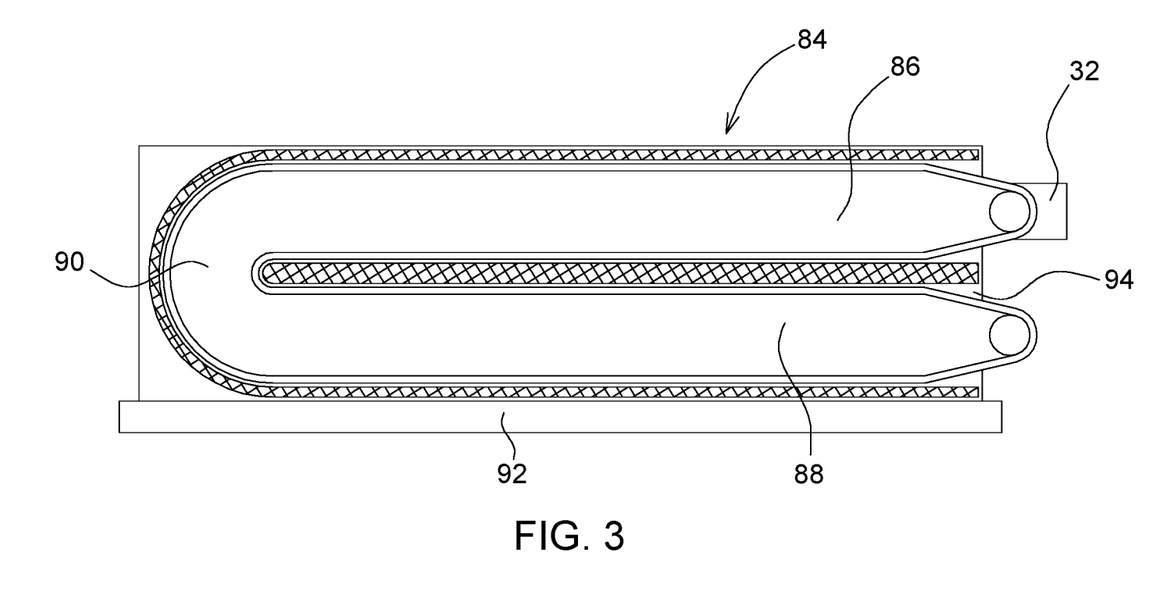
FIG. 3 is a side view of an intermediate mounting plate that is an alternate embodiment of a cover plate for a corresponding wall illustrated in FIG. 1.

FIG. 3 is a side view an intermediate mounting plate 84 that is an alternate embodiment of a cover plate (54, 56) for covering the first wall 12 or second wall 14. The intermediate mounting plate 84 replaces an inner cover plate (54, 56) of a first electrical assembly 11 and the inner cover plate of a second electrical assembly. The intermediate mounting plate 84 can be used to join two or more housings 10 together, or to join similar electrical assemblies 11 together in series, as illustrated in FIG. 4.

In one embodiment, each intermediate mounting plate 84 comprises a base 92 that supports a generally planar wall structure 94 with a curved opening. The curved opening has an upper opening portion 86, an arched opening portion 90 and a lower opening portion 88, that are surrounded or defined by a mating surface (e.g., protruding lip) for mating with one or more of the following sets of items: (1) the first inbound cavity 22, the first outbound cavity 24, and first interface region 45 of the housing 10, and (2) the second inbound cavity 26, the second outbound cavity 28, and the second interface region of the housing 10. Further, the intermediate mounting plate 84 can provide a hermetic seal on both sides of the intermediate mounting plate 84 to respective housings 10 or electrical assemblies on each side of the intermediate mounting plate 84. The intermediate mounting plate 84 can create a sealed aggregate chamber or cavity that can hold coolant and is formed of: (1) the first inbound cavity 22, the first outbound cavity 24, and first interface region 45 of the housing 10, and (2) the second inbound cavity 26, the second outbound cavity 28, and the second interface region of the housing 10.

Figure 4:
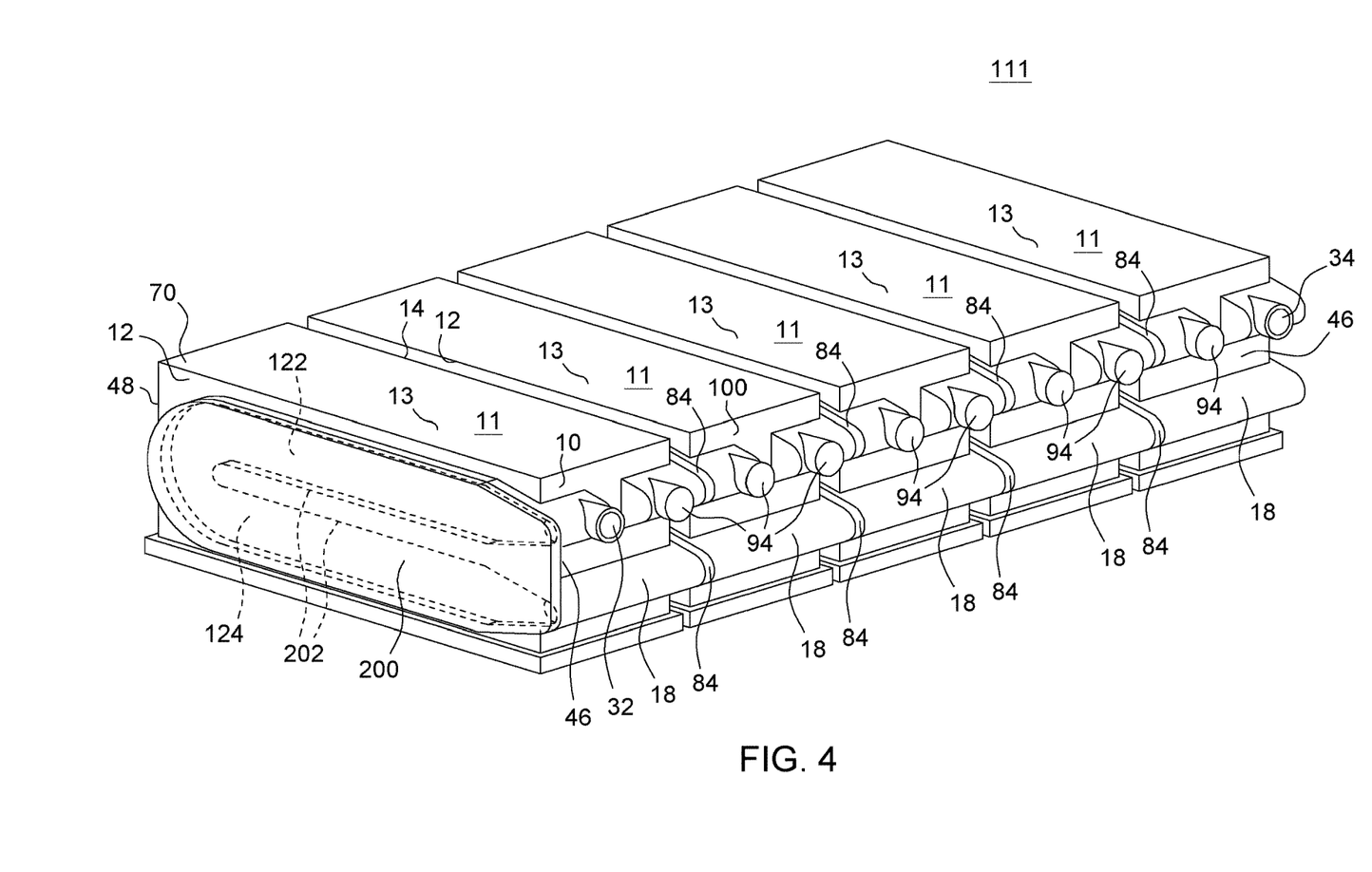
FIG. 4 is a side view of another alternate embodiment of the electrical assembly in which multiple electrical assemblies are ganged together with respective mounting plates of FIG. 3 to form an aggregate electrical assembly.

FIG. 4 is a side view of another alternate embodiment of an electrical assembly 111 in which multiple electrical assemblies 11 are connected or ganged together with respective intermediate mounting plates 84 of FIG. 3 to form an aggregate electrical assembly 111. As illustrated, the intermediate inlet port 32 and output 30 ports of the aggregate electrical assembly are capped, plugged or sealed with caps 94 such that there is one inlet port 32 associated with the first electrical assembly 11 and one outlet port 34 associated with the last (e.g. Nth, where N equals any positive integer or whole number greater than two) electrical assembly 11. FIG. 4 shows six electrical assemblies 11 that are connected together in series via five corresponding intermediate plates 84, although virtually any number of electrical assemblies greater than or equal to two (e.g., N greater than or equal to two) can be connected with the intermediate plates 84.

In FIG. 4, the left side of the electrical assembly 111 terminates in an end cover plate 200 that is bonded, adhered, secured or fastened to the side of the electrical assembly 111. Underneath the end cover plate, walls 202 extend perpendicularly outward from the side of the electrical assembly 11, where the walls define an inbound cavity 122 for receiving coolant from inlet port 32 and an outbound cavity 124 for conveying the coolant from a back side 48 to the front side 46 or transition passage 18. The inner portion of walls 202 is shown in dashed lines in FIG. 4 to indicate that it is underneath the end cover plate 200. The outer portion of walls 202 is beneath or coextensive with an outer periphery of the end cover plate 200, for example.

In one embodiment, a first unit 70 comprises the housing 10, its first wall 12, its second wall 14 and its transition passage 18 that hydraulically interconnects the first wall 12 and the second wall 14 of the first unit 70. Similarly, a second unit 72 comprises a secondary housing 100, its first wall 12, its second wall 14 and its transition passage 18 that hydraulically interconnects the first wall 12 and the second wall 14 of the second unit 72. The intermediate plate 84 is configured or adapted to couple the first unit 70 to the second unit 72 (e.g., by sealant, adhesive, fasteners or other retainers that facilitate hermetic seal of the coolant within the interior of the first unit 70 and second unit 72) such the coolant is in hydraulic communication between the first unit 70 and the second unit 72. In one configuration, sealant, adhesive or adhesive tape (e.g., VHB adhesive or adhesive tape, available through the 3M Company) may be used on both sides of each intermediate plate 84 to interconnect the first unit and the second unit 72, along with other units. For example, the intermediate plate 84 connects the second wall 14 of the first unit 70 to the first wall 12 of the second unit 72 to form a sealed aggregate chamber for the coolant. The intermediate mounting plate 84 can create a sealed aggregate chamber or cavity that can hold coolant and is formed of: (1) the first inbound cavity 22, the first outbound cavity 24, and first interface region 45 of the housing 100 of the second unit 72, and (2) the second inbound cavity 26, the second outbound cavity 28, and the second interface region of the housing 10 of the first unit 70.

Figure 6:
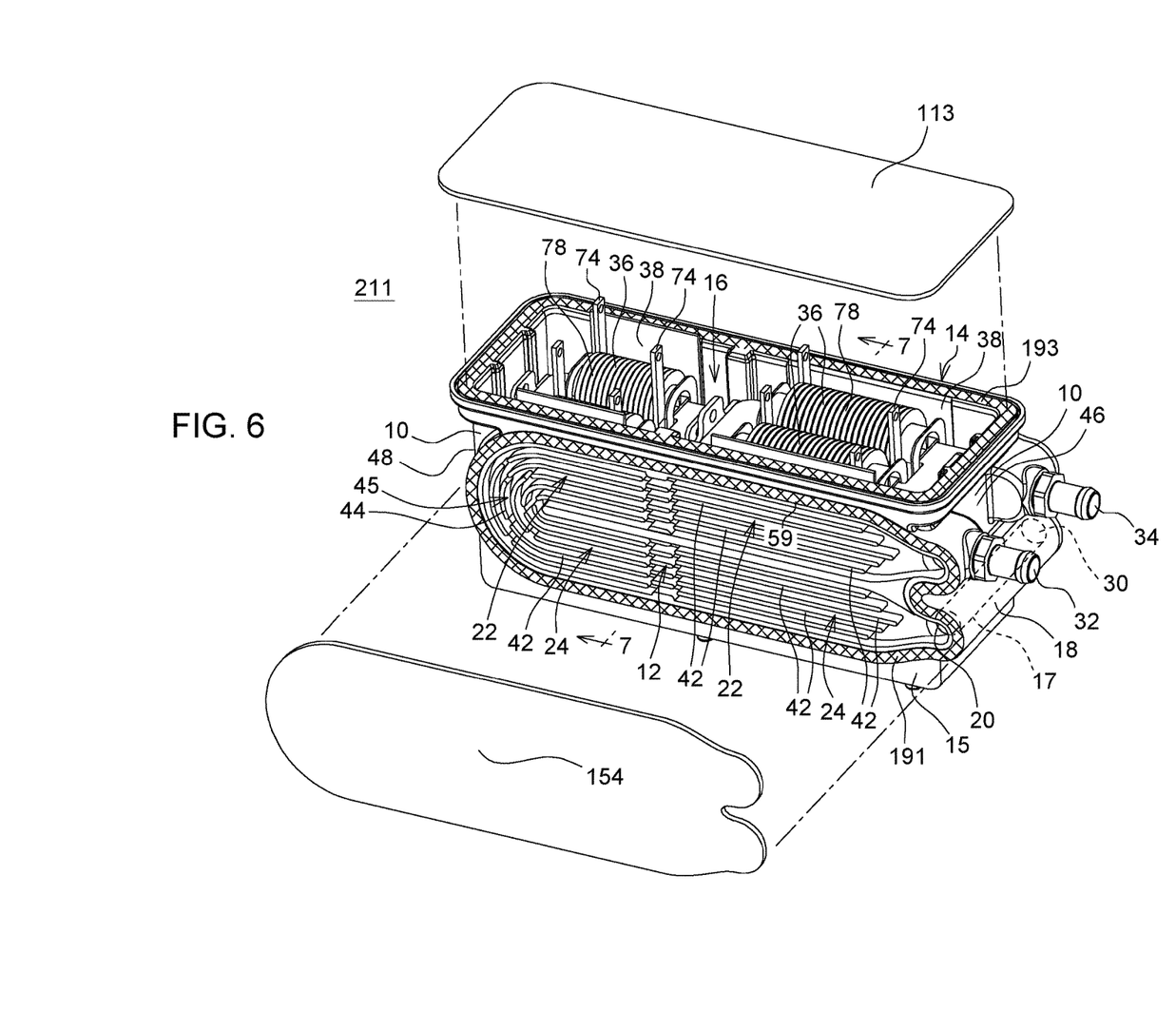
FIG. 6 is perspective view of an alternate embodiment of an electrical assembly, where the electrical assembly is illustrated as partially exploded.
Figure 7:
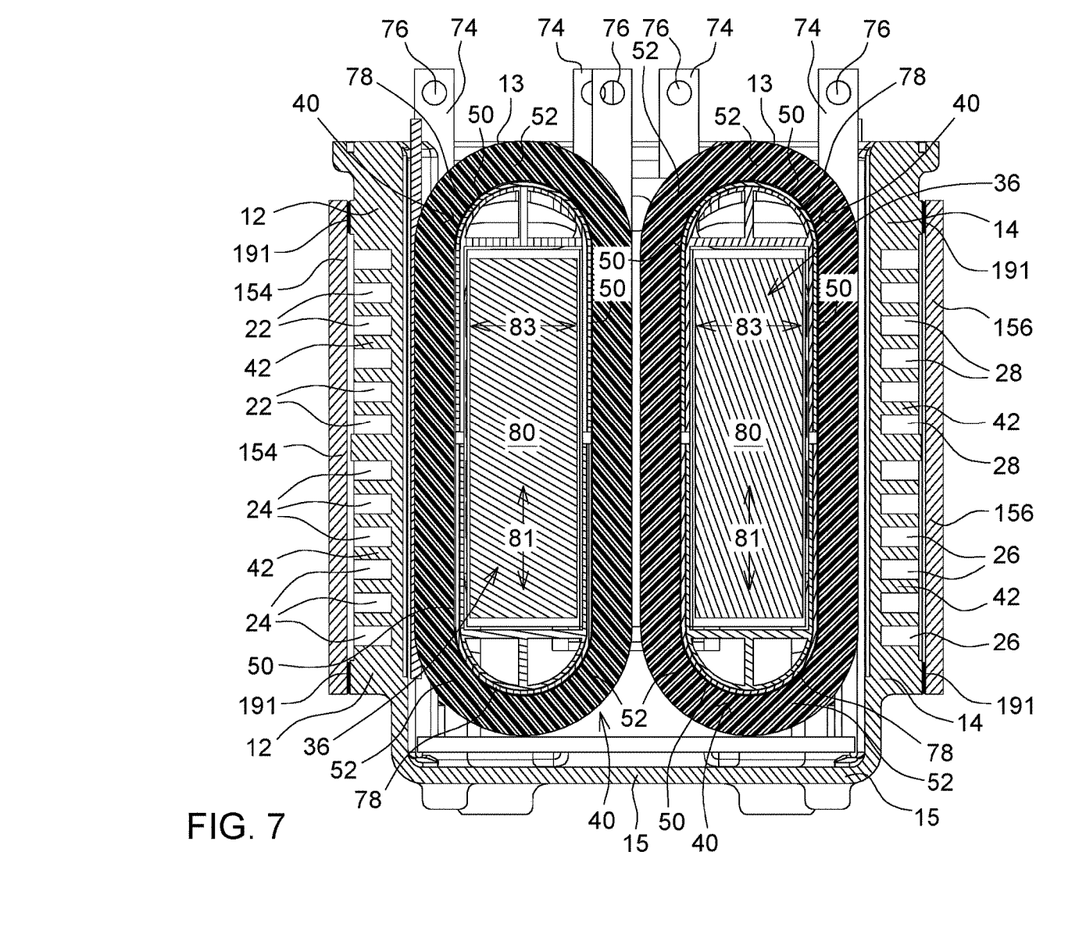
FIG. 7 is a cross-sectional view of the electrical assembly of FIG. 6 as viewed along reference line 7-7 of FIG. 6.

FIG. 6 is perspective view of an alternate embodiment of an electrical assembly 211, where the electrical assembly 211 is illustrated as partially exploded. The electrical assembly 211 of FIG. 6 is similar to the electrical assembly 11 of FIG. 1, except that the electrical assembly 211 of FIG. 6 is replaces covers 13, 54 and 56, with covers 113, 154 and 156. The cover 13, the first cover plate 154 and the second cover plate 157 do not have any openings for fasteners, but are rather secured, bonded or attached to the rest of the electrical assembly 211 via sealant (191, 193). For example, cover 113 is secured, bonded or attached to the upper portion of the electrical assembly 211 via sealant 193 in a recess or channel in the upper portion; cover 154 is secured, bonded or attached to a side portion (e.g. on one side) of the electrical assembly 211 via sealant 191 in a recess or channel in the side portion; cover 156 (in FIG, 7) is secured, bonded or attached to a side portion (e.g., on an opposite side) of the electrical assembly 211 via sealant 191 in a recess or channel in the side portion.

In one embodiment, the sealant (191, 193) may comprise an adhesive, a polymer, a plastic or elastomer or another suitable material for forming a bond and/or seal. For example, the sealant may comprise an adhesive or adhesive tape like VHB adhesive or tape, where VHB is a trademark of 3M Company, St. Paul, Minn. 55144. The sealant needs to create a liquid barrier to retain the coolant within the electrical assembly 211, while being resistant to various potentially corrosive chemicals in the coolant. The sealant (191, 193) can be selected to not require the application of heat for curing, in contrast to some alternative techniques like welding, brazing or soldering to join or attach housing components or covers to the electrical assembly 211.

FIG. 7 is a cross-sectional view of the electrical assembly 211 of FIG. 6 as viewed along reference line 7-7 of FIG. 6. Like reference numbers in FIG. 6, FIG. 7 and FIG. 2 indicate like elements. FIG. 7 is similar to FIG. 2 except the electrical assembly 211 of FIG. 6 is replaces covers 13, 54 and 56, with covers 113, 154 and 156. Further, the first cover plate 154 and the second cover plate 156 are attached to the sides of the electrical assembly 211 via a sealant 191 in a recess or groove of the sides of the electrical assembly 211.

Having described the preferred embodiment, it will become apparent that various modifications can be made without departing from the scope of the invention as defined in the accompanying claims.

The following is claimed:

1. An electrical assembly comprising:
   a housing comprising a first wall and a second wall spaced apart from the first wall, an interior defined between the first wall and the second wall;
   a transition passage having an input and an output;
   the first wall having a first inbound cavity for receiving a coolant from an inlet port, the first wall having a first outbound cavity for directing the coolant to the input of the transition passage;
   the second wall having a second inbound cavity for receiving a coolant from the output of the transition passage, the second wall having second outbound cavity for directing the coolant from the second inbound cavity to the outlet port;
   the transition passage comprising a transverse hollow volume for interconnecting the first outbound cavity of the first wall to the second inbound cavity of a second wall; and
   at least one inductor in the interior of the housing with a gap between the at least one conductor and the first wall or the second wall, the inductor covered by a thermal interface material to fill the gap.

2. The assembly according to claim 1 wherein the first inbound cavity comprises ridges to direct a flow of the coolant between a front side and a rear side of the housing, the first outbound cavity comprises ridges to direct the flow of coolant between the rear side and front side; a set of curved ridges providing an interface between the first inbound cavity and the first outbound cavity.

3. The assembly according to claim 2 wherein the second inbound cavity comprises ridges to direct a flow of the coolant between a front side and a rear side of the housing, the second outbound cavity comprises ridges to direct a flow of coolant between the rear side and the front side; a set of curved ridges provide an interface between the second inbound cavity and the second outbound cavity.

4. The assembly according to claim 1 wherein the thermal interface material comprises an inner thermal interface layer contacting the at least one inductor and an outer thermal interface layer contacting an interior surface of the first wall or the second wall.

5. The assembly according to claim 4 wherein the inner thermal interface layer comprises a polyimide film or a polyethylene terephthalate film.

6. The assembly according to claim 1 wherein the thermal interface material has a generally oval or oblong shape that conforms to the outer surface of the at least one inductor.

7. The assembly according to claim 1 wherein the thermal interface material comprises a thermally conductive potting material or filler.

8. The assembly according to claim 1 wherein a first cover plate covers the first inbound cavity and the second outbound cavity and wherein a second cover plate covers the second inbound cavity and the second outbound cavity.

9. The assembly according to claim 8 wherein the first cover plate is secured or attached to one side of the assembly via a plurality of fasteners and wherein the second cover plate is secured or attached to an opposite side of the assembly via the plurality of fasteners.

10. The assembly according to claim 8 wherein the first cover plate is secured, bonded or attached to one side of the assembly via a sealant and wherein the second cover plate is secured, bonded or attached to an opposite side of the assembly via the sealant.

11. The assembly according to claim 1 further comprising:
    a radiator for receiving coolant from the outlet port;
    a pump connected in series with the radiator to circulate coolant within the cavities, the transition passage, and the radiator.

12. The assembly according to claim 1 wherein:
    a first unit comprises the housing, its first wall, its second wall and its transition passage that interconnects the first wall and the second wall;
    a second unit comprising a secondary housing, its first wall, its second wall and its transition passage that interconnects the first wall and the second wall;
    an intermediate plate for coupling the first unit to the second unit such the coolant is in hydraulic communication between the first unit and the second unit.

13. The assembly according to claim 1 wherein the intermediate plate connects the second wall of the first unit to the first wall of the second unit to form an aggregate chamber for the coolant.

* * * * *